United States Patent
Nagano

(10) Patent No.: US 7,187,729 B2
(45) Date of Patent: Mar. 6, 2007

(54) VITERBI DECODER

(75) Inventor: Kouichi Nagano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 772 days.

(21) Appl. No.: 10/339,321

(22) Filed: Jan. 10, 2003

(65) Prior Publication Data

US 2003/0169833 A1 Sep. 11, 2003

(30) Foreign Application Priority Data

Mar. 8, 2002 (JP) ............................. 2002-063480

(51) Int. Cl.
*H03D 1/00* (2006.01)

(52) U.S. Cl. .................... 375/341; 369/59.22

(58) Field of Classification Search ................ 375/340, 375/341, 316; 369/59.22
See application file for complete search history.

(56) References Cited

U.S. PATENT DOCUMENTS

| | | | | |
|---|---|---|---|---|
| 3,662,338 A | * | 5/1972 | Cain, III | ....................... 714/793 |
| 4,715,037 A | * | 12/1987 | Yagi | ........................... 714/795 |
| 5,901,128 A | * | 5/1999 | Hayashi et al. | .......... 369/59.22 |
| 5,923,713 A | | 7/1999 | Hatakeyama | |
| 6,052,413 A | * | 4/2000 | Fukuoka | ..................... 375/235 |
| 6,594,795 B1 | | 7/2003 | Satou | |
| 2003/0002419 A1 | * | 1/2003 | Kuma et al. | .............. 369/59.22 |

FOREIGN PATENT DOCUMENTS

| | | |
|---|---|---|
| CN | 1281296 A | 1/2001 |
| JP | 61-128632 | 6/1986 |
| JP | 09-320206 | 12/1997 |
| JP | 10-320931 | 12/1998 |
| JP | 2001-250334 A | 9/2001 |

OTHER PUBLICATIONS

Tarui, Tadaaki., et al. "Electronic Circuit Course 10." Digital Computing Circuit, Asakusa Shoten Publishing Co, Ltd., 7th Edition, Mar. 20, 1997, p. 65.

* cited by examiner

*Primary Examiner*—Kevin Burd
(74) *Attorney, Agent, or Firm*—McDermott Will & Emery LLP

(57) ABSTRACT

A path storing circuit has path holding parts at a plurality of stages storing a survivor path and corresponding to times. A majority decision circuit receives output values of three delay circuits including the top and bottom delay circuits each receiving a selected output of a selector out of six delay circuits in the path holding part at the final stage and makes a decision by a majority.

10 Claims, 11 Drawing Sheets state transition diagram trellis diagram

VITERBI DECODER

BACKGROUND OF THE INVENTION

The present invention relates to a signal process of a reproducing unit in a communication system or a recording/reproducing apparatus and, more particularly, to a technique of Viterbi decoding used to decode a reproduction signal in a maximum likelihood manner.

A Viterbi decoder is used to, for example, detect and correct an error in a signal subjected to waveform equalization at the time of reproducing a signal in a communication system or a recording/reproducing apparatus. By using waveform equalization and Viterbi decoding in a signal process, BER (Bit Error Rate) can be decreased.

FIG. 9 is a diagram showing the internal configuration of a path storing circuit provided in a conventional Viterbi decoder. Shown in FIG. 9 are path selection signals SEL0 and SEL1, an initial value 21 of a path holding part, path holding parts 31, 32, ..., and 3n for holding a survivor path, and selectors 4 for selecting a value to be input to the path holding parts 31 to 3n in accordance with the path selection signals SEL0 and SEL1. The path holding parts 31 to 3n are provided at a plurality of stages ("n" stages) and each stage corresponds to time.

FIGS. 10 and 11 are a state transition diagram and a trellis diagram, respectively, showing states in Viterbi decoding. FIGS. 10 and 11 show six states of S0, S1, S2, S3, S4, and S5. Each of the states S0 and S5 has a branch pattern. As a modulating system, an 8–16 modulation code is used. The 8–16 modulation has a characteristic that the length of continuous sequences of the same code of a signal modulated lies in a range from 2 to 10. After NRZI transform, the characteristic becomes that the length of continuous sequences of the same code of the signal lies in a range from 3 to 11.

Each of the path holding parts 31, 32, ..., and 3n has delay circuits of the number corresponding to the number of states. The top delay circuit and the bottom delay circuit receive signals selected according to the path selection signals SEL0 and SEL1, respectively. With such a configuration, the path holding part 3n at the final stage has the oldest signal. When a signal is decoded by maximum likelihood decoding, output values of all of the delay circuits of the path holding part 3n at the final stage become the same value. In other words, when output values of the delay circuits of the path holding part 3n at the final stage are not the same value, it means that an error occurs in decoding.

When circuits are formed in an LSI, in many cases, an output value of one of the delay circuits of the path holding part 3n is used as an output value of a path storing circuit and a maximum likelihood decision circuit at the post stage is not provided in consideration of a circuit scale. In order to improve the performance of Viterbi decoding, consequently, the number of stages of the path holding parts is usually increased.

In order to improve the performance of Viterbi decoding, there is also a case that a majority decision circuit is provided. FIG. 12 is a diagram showing an example of the configuration of a path storing circuit including a conventional majority decision circuit. In the configuration of FIG. 12, a majority decision circuit 80 receives output values of all of delay circuits of the path holding part 3n at the final stage, makes a decision by a majority, and outputs the majority value as an output value of the path storing circuit. With the configuration, improvement in performance of Viterbi decoding is realized.

However, a problem occurs such that the circuit scale increases vainly in order to realize improvement in performance of Viterbi decoding.

Specifically, in the case of increasing the number of stages of the path holding parts to improve the performance of Viterbi decoding, the circuit scale of the path storing circuit accordingly increases. In the case of making a decision by a majority by using all of state values to improve the performance of Viterbi decoding, a large-scale majority decision circuit is required. The circuit scale of the path storing circuit increases by the increased amount of the majority decision circuit and it also disturbs high processing speed of the circuit.

SUMMARY OF THE INVENTION

An object of the present invention is to improve the performance of a Viterbi decoder while suppressing an increase in the circuit scale.

Concretely, according to the present invention, there is provided a Viterbi decoder including a path storing circuit, and the path storing circuit includes: path holding parts at a plurality of stages corresponding to times, respectively, the path holding parts storing a survivor path; a plurality of selectors for selecting a value to be input to the path holding parts in accordance with a path selection signal; and a majority decision circuit for receiving output values of a part of delay circuits in the path holding part at the final stage and making a majority decision.

According to the present invention, a majority decision is made by using output values of a part of the delay circuits in the path holding part at the final stage. Consequently, the circuit scale of the required majority decision circuit is sufficiently small and, moreover, the performance of Viterbi decoding can be improved. Therefore, the high-precision Viterbi decoder with a small circuit scale can be realized.

Preferably, the majority decision circuit in the Viterbi decoder according to the present invention receives output values of half or less of the delay circuits in the path holding part at the final stage.

Preferably, the Viterbi decoder according to the present invention decodes a signal which is waveform equalized by a waveform equalizer, the waveform equalizer has four taps, and tap coefficients satisfy the relation of "a, b, b, a".

Preferably, the Viterbi decoder according to the present invention decodes a signal which is waveform equalized by a waveform equalizer, and the waveform equalizer receives a signal modulated by an 8–16 modulation code of which length of continuous sequences of the same code lies in a range from 2 to 10.

Preferably, the majority decision circuit in the Viterbi decoder according to the present invention receives outputs of all of delay circuits each receiving a selected output of the selector in the path holding part at the final stage.

Preferably, the path storing circuit in the Viterbi decoder according to the present invention has a same signal decision circuit for determining whether all of values input to the majority decision circuit are the same or not.

Preferably, the majority decision circuit in the Viterbi decoder according to the present invention receives output values of three delay circuits in the path holding part at the final stage.

Preferably, the majority decision circuit receives the output values of the three delay circuits as first, second, and third input signals and includes: an exclusive-OR circuit receiving the first and third input signals; a first AND circuit receiving the first and third input signals; a second AND circuit receiving an output of the exclusive-OR circuit and the second input signal; and an OR circuit receiving an output of the first AND circuit and an output of the second AND circuit, and outputs an output of the OR circuit as a result of the majority decision.

Preferably, the majority decision circuit receives the output values of the three delay circuits as first, second, and third input signals and includes: a first OR circuit receiving the first and third input signals; a first AND circuit receiving the first and third input signals; a second AND circuit receiving an output of the first OR circuit and the second input signal; and a second OR circuit receiving an output of the first AND circuit and an output of the second AND circuit, and outputs an output of the second OR circuit as a result of the majority decision.

Preferably, the majority decision circuit receives the output values of the three delay circuits as first, second, and third input signals and includes: a first NOT circuit receiving the first signal; a second NOT circuit receiving the third input signal; a first NAND circuit receiving an output of the first NOT circuit and an output of the second NOT circuit; a second NAND circuit receiving the first and third input signals; a third NAND circuit receiving an output of the first NAND circuit and the second input signal; and a fourth NAND circuit receiving an output of the second NAND circuit and an output of the third NAND circuit, and outputs an output of the fourth NAND circuit as a result of the majority decision.

DETAILED DESCRIPTION OF THE INVENTION

Hereinafter, preferred embodiments of the present invention will be described with reference to the accompanying drawings.

Embodiment 1

Figure 1:
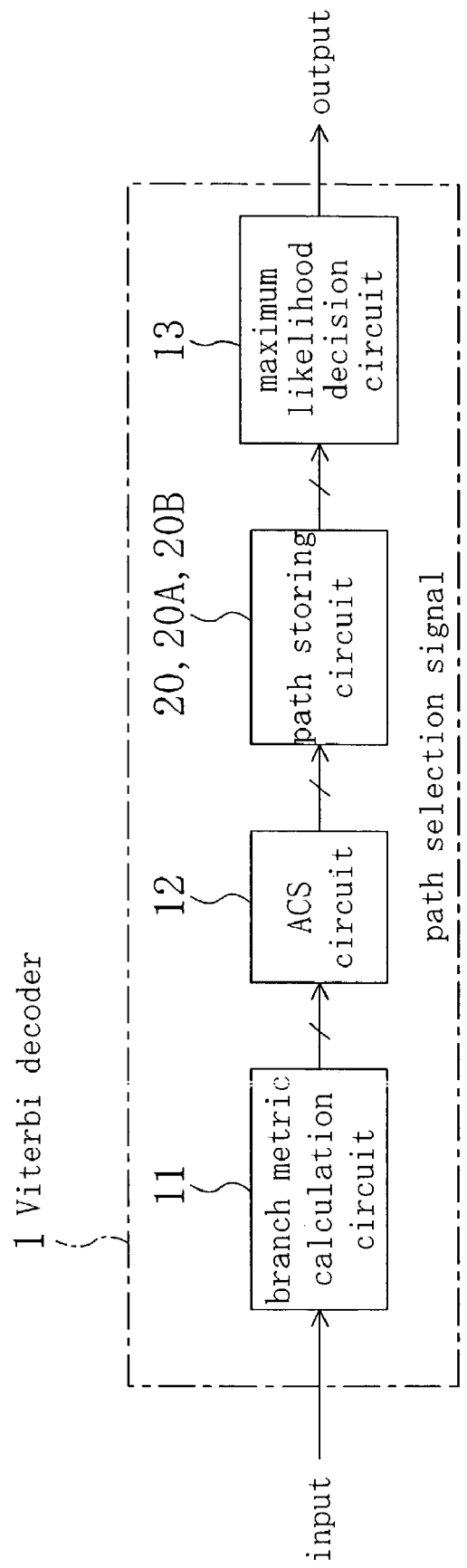
FIG. 1 is a block diagram showing the configuration of a Viterbi decoder.

FIG. 1 is a block diagram showing the configuration of a Viterbi decoder according to a first embodiment. A Viterbi decoder 1 shown in FIG. 1 has a branch metric circuit 11, an add compare select (ACS) circuit 12, a path storing circuit 20, and a maximum likelihood decision circuit 13, and the configuration is similar to the conventional technique. The first embodiment is different from the conventional technique with respect to the internal configuration of the path storing circuit 20.

The branch metric circuit 11 calculates a branch metric which shifts from a certain state to another state in the trellis diagram, and the ACS circuit 12 performs addition, comparison, and selection of the minimum value (ACS computation) by using an output of the branch metric circuit 11 and outputs a path selection signal. The path storing circuit 20 stores the path selection signal output from the ACS circuit 12, thereby storing a path in the trellis diagram. Finally, the maximum likelihood decision circuit 13 reads out the path selection signal from the path storing circuit 20 and executes decoding. In some circuit configurations, the maximum likelihood decision circuit 13 is not provided.

Figure 2:
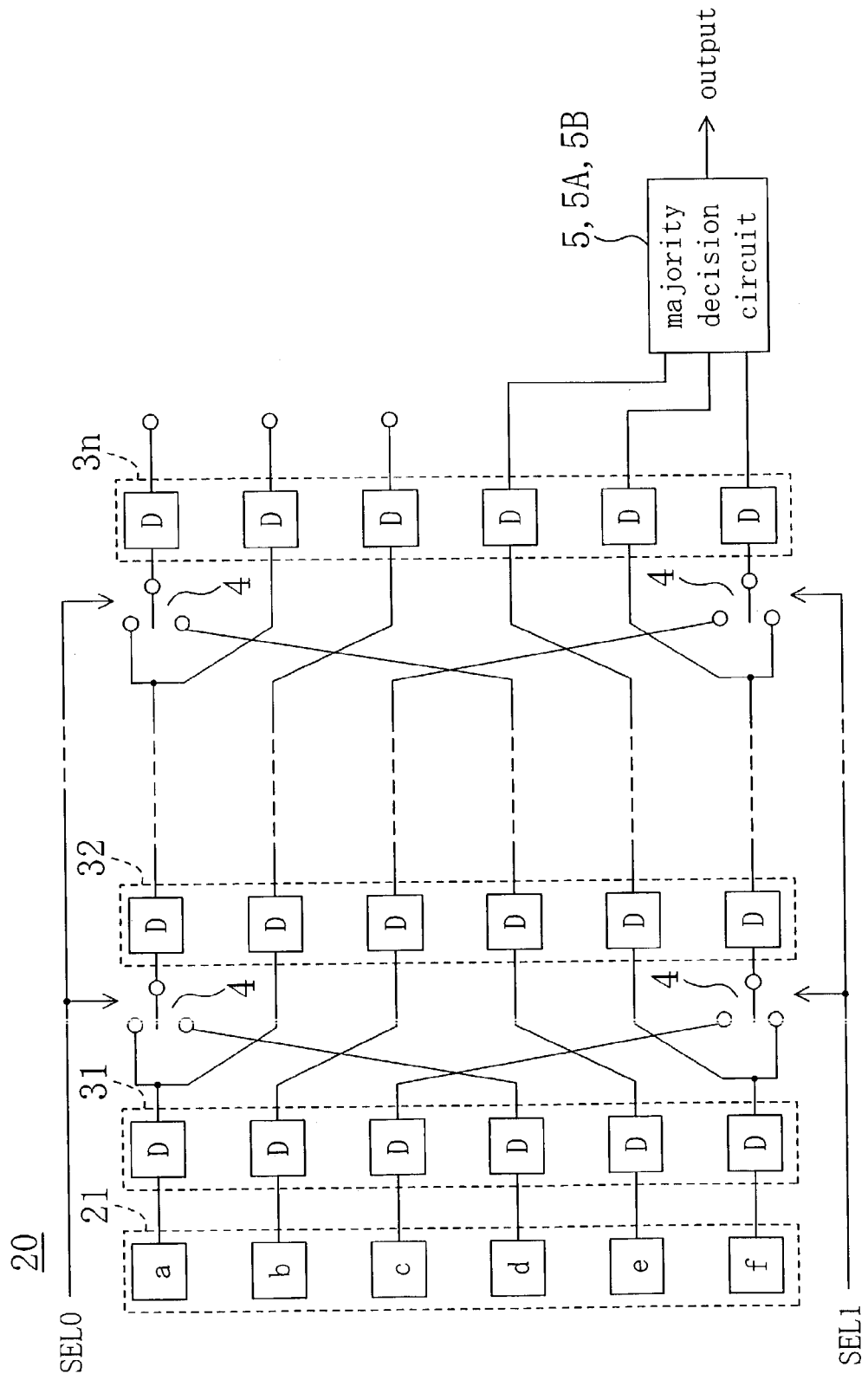
FIG. 2 is a diagram showing the internal configuration of a path storing circuit of a Viterbi decoder according to a first embodiment of the present invention.
Figure 10:
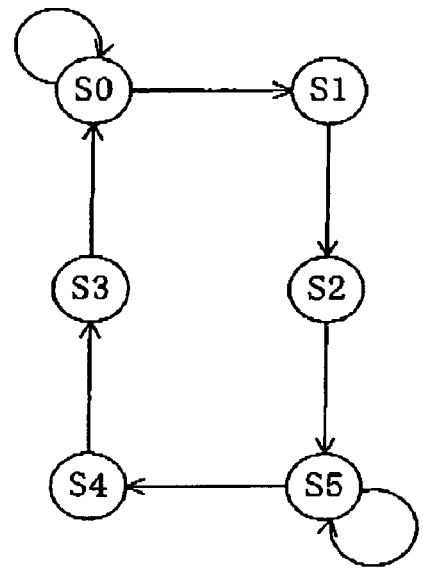
FIG. 10 is a state transition diagram showing Viterbi decoding.
Figure 11:
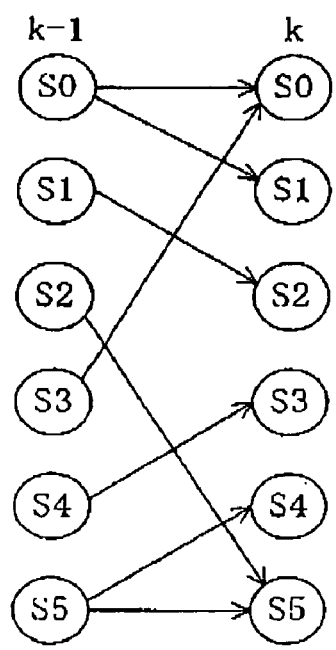
FIG. 11 is a trellis diagram showing Viterbi decoding.

FIG. 2 is a diagram showing the internal configuration of the path storing circuit 20 according to the first embodiment. In FIG. 2, the same components as those in FIG. 12 of the conventional technique are designated by the same reference numerals and their detailed description will not be repeated here. Different from FIG. 12 in which the majority decision circuit 80 receives outputs of all of the delay circuits in the path holding part $3n$ at the final stage, in FIG. 2, a majority decision circuit 5 receives outputs of three delay circuits out of delay circuits in the path holding part $3n$ at the final stage. Basic operations are similar to those in the conventional technique as shown in FIGS. 10 and 11.

Output values of the delay circuits in the path holding part $3n$ at the final stage are supposed to be the same value under normal operating conditions. When the characteristics of a communication path or a recording/reproducing system deteriorate due to noise or other factors, output values of the delay circuits are not always the same value. In this case, the number of delay circuits outputting a correct value is larger than the number of delay circuits outputting an incorrect value.

Figure 9:
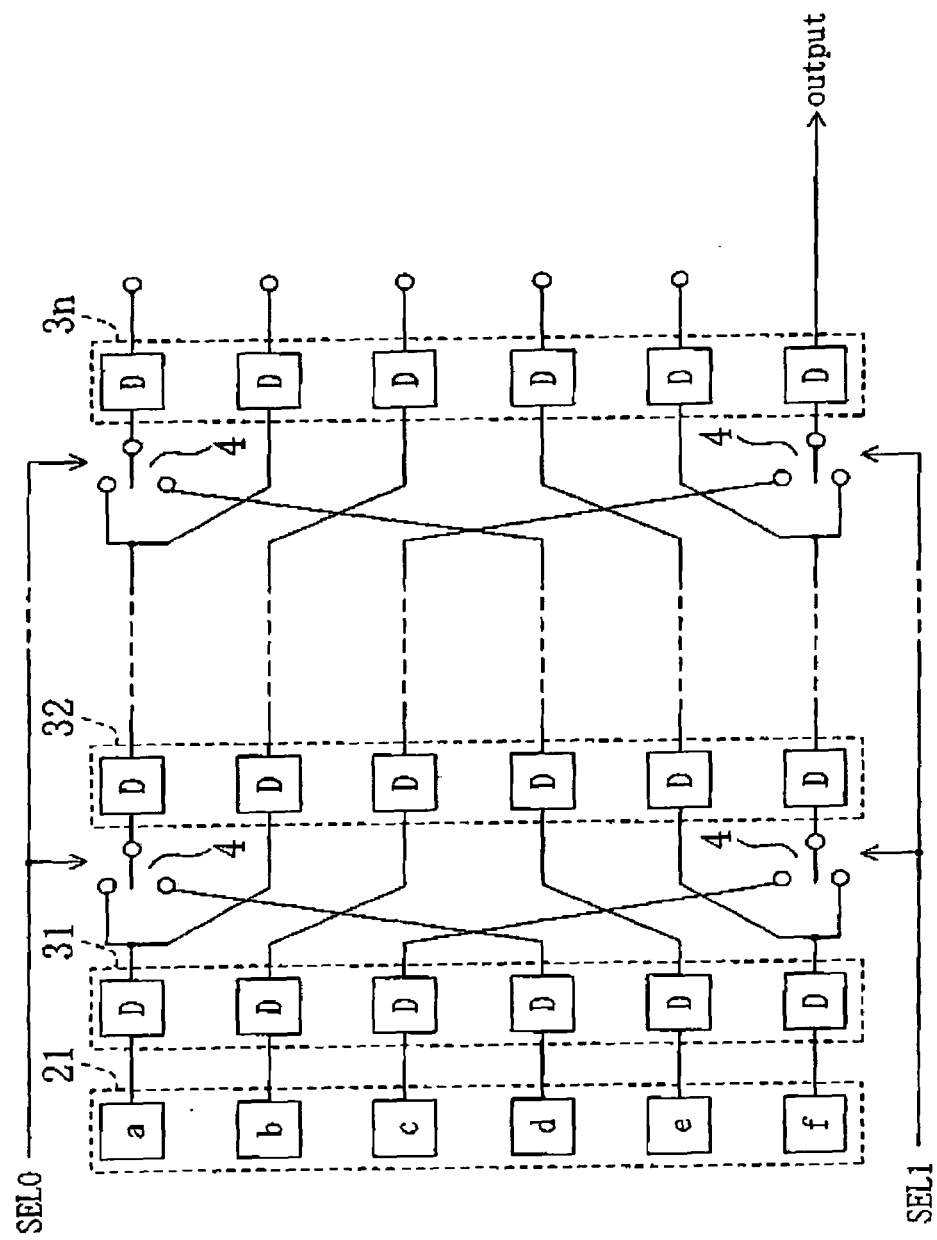
FIG. 9 is a diagram showing the internal configuration of a path storing circuit of a conventional Viterbi decoder.

For example, as in the conventional path storing circuit shown in FIG. 9, in the case where only an output value of one of the delay circuits in the path holding part $3n$ at the final stage is used as an output of the path storing circuit, if only the output value of the delay circuit as the output value of the path storing circuit is erroneous, decoding is not carried out normally. Consequently, the performance of the Viterbi decoder deteriorates.

Figure 12:
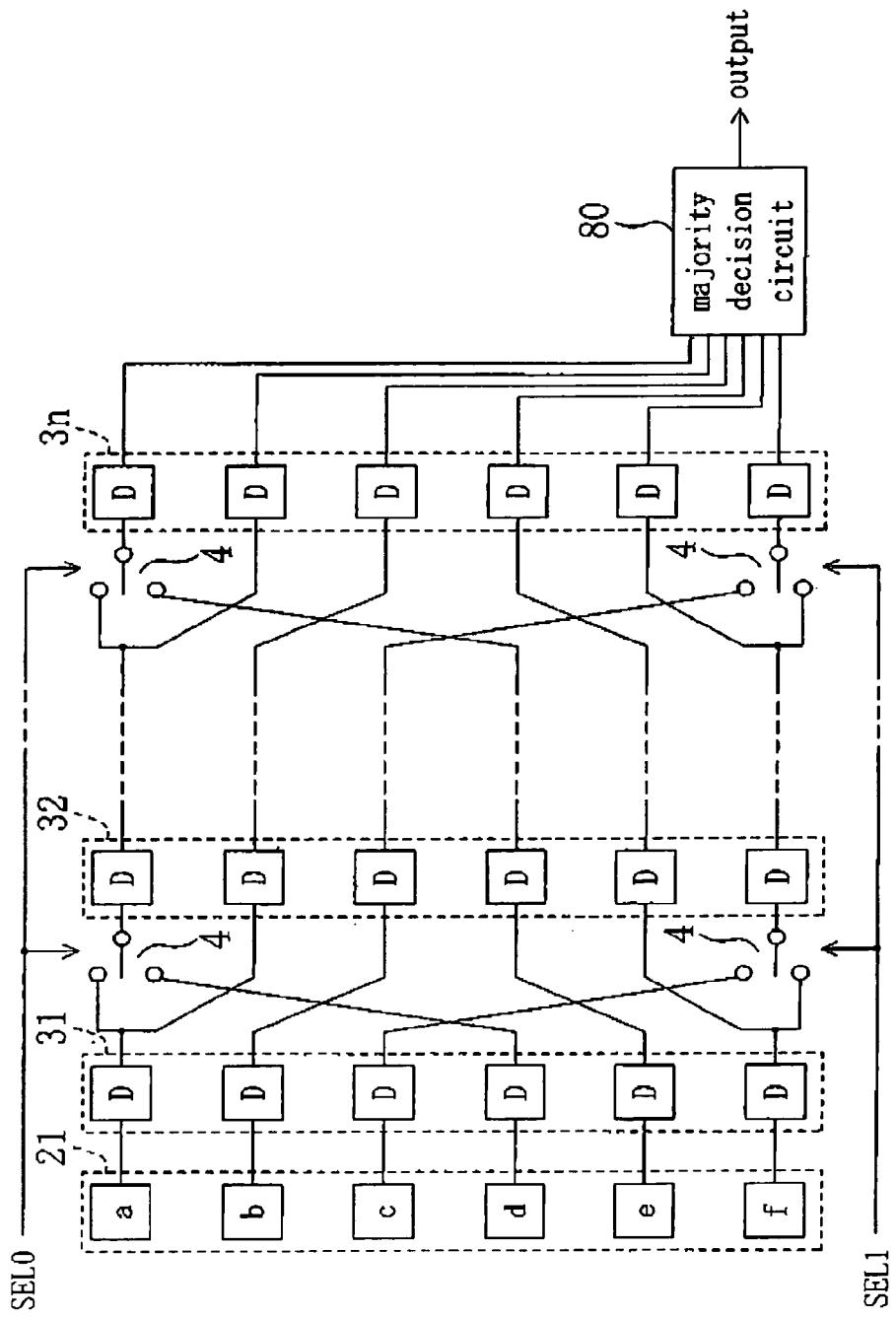
FIG. 12 is a diagram showing the internal configuration of a path storing circuit including a conventional majority decision circuit.

In contrast, in the path storing circuit including the conventional majority decision circuit, as shown in FIG. 12, by providing the majority decision circuit 80 for making a decision by a majority by using outputs of all of delay circuits in the path holding part $3n$ at the final stage, deterioration in the performance of the Viterbi decoder is prevented. However, by providing such a majority decision circuit, a problem occurs such that the circuit scale of the Viterbi decoder increases as a whole.

In the embodiment, therefore, the majority decision circuit 5 receives output values of a part of the delay circuits in the path storing part $3n$ at the final stage, in this case, output values of three delay circuits as inputs and makes a decision by a majority. If only one of output values of the three delay circuits is erroneous, the error can be corrected by the majority decision circuit 5, and a normal value can be output as an output value of the path storing circuit 20. Moreover, as compared with the conventional majority decision circuit for receiving output values of all of delay circuits, the circuit configuration is much simplified. In other words, only by adding the very small circuits, the performance of the Viterbi decoding can be improved. Only by an amount of the improvement achieved by the majority decision circuit 5, the number of stages of the path holding circuit can be also decreased.

Figure 3:
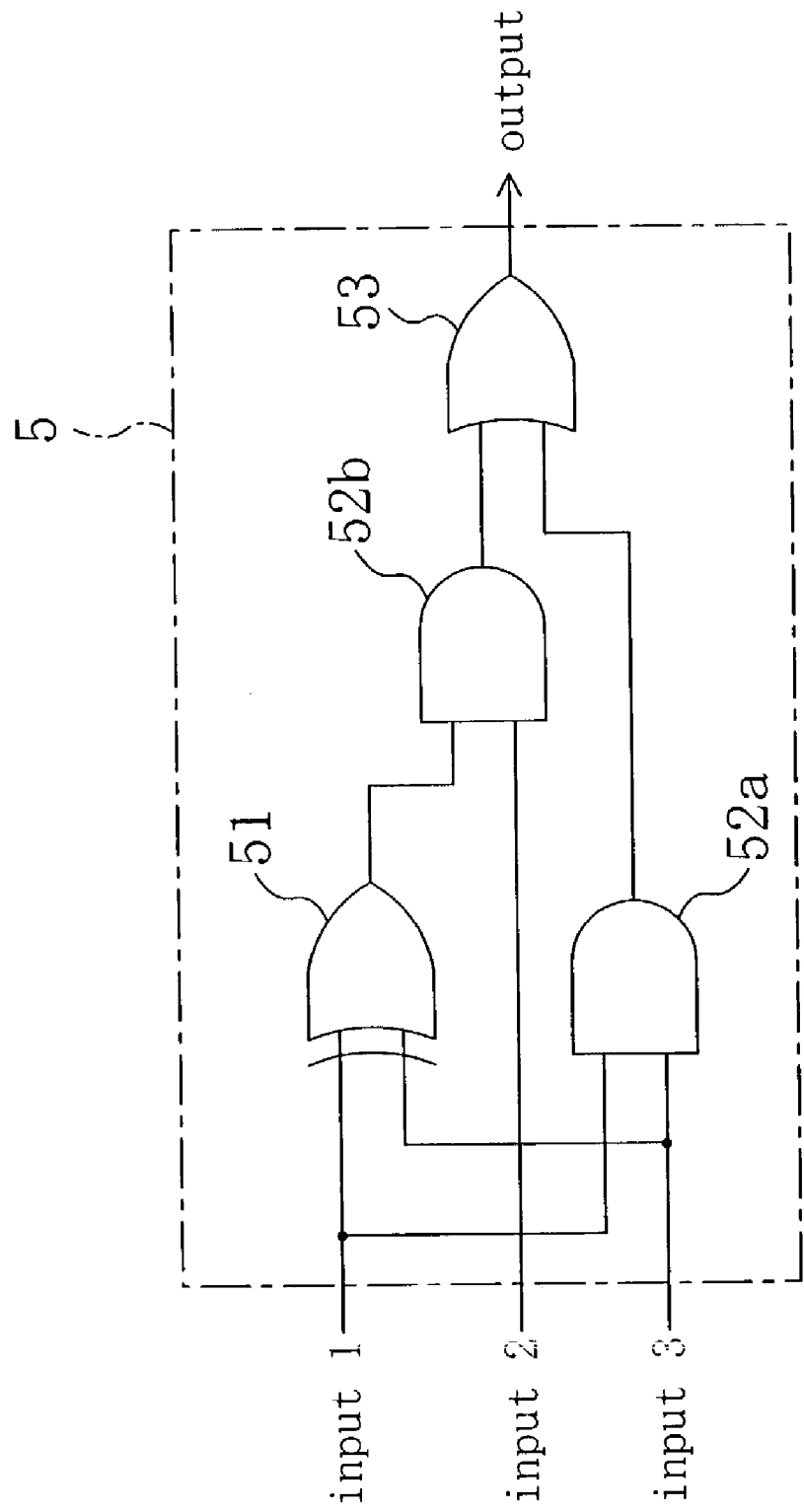
FIG. 3 shows an example of the circuit configuration of a majority decision circuit in FIG. 2.
Figure 4:
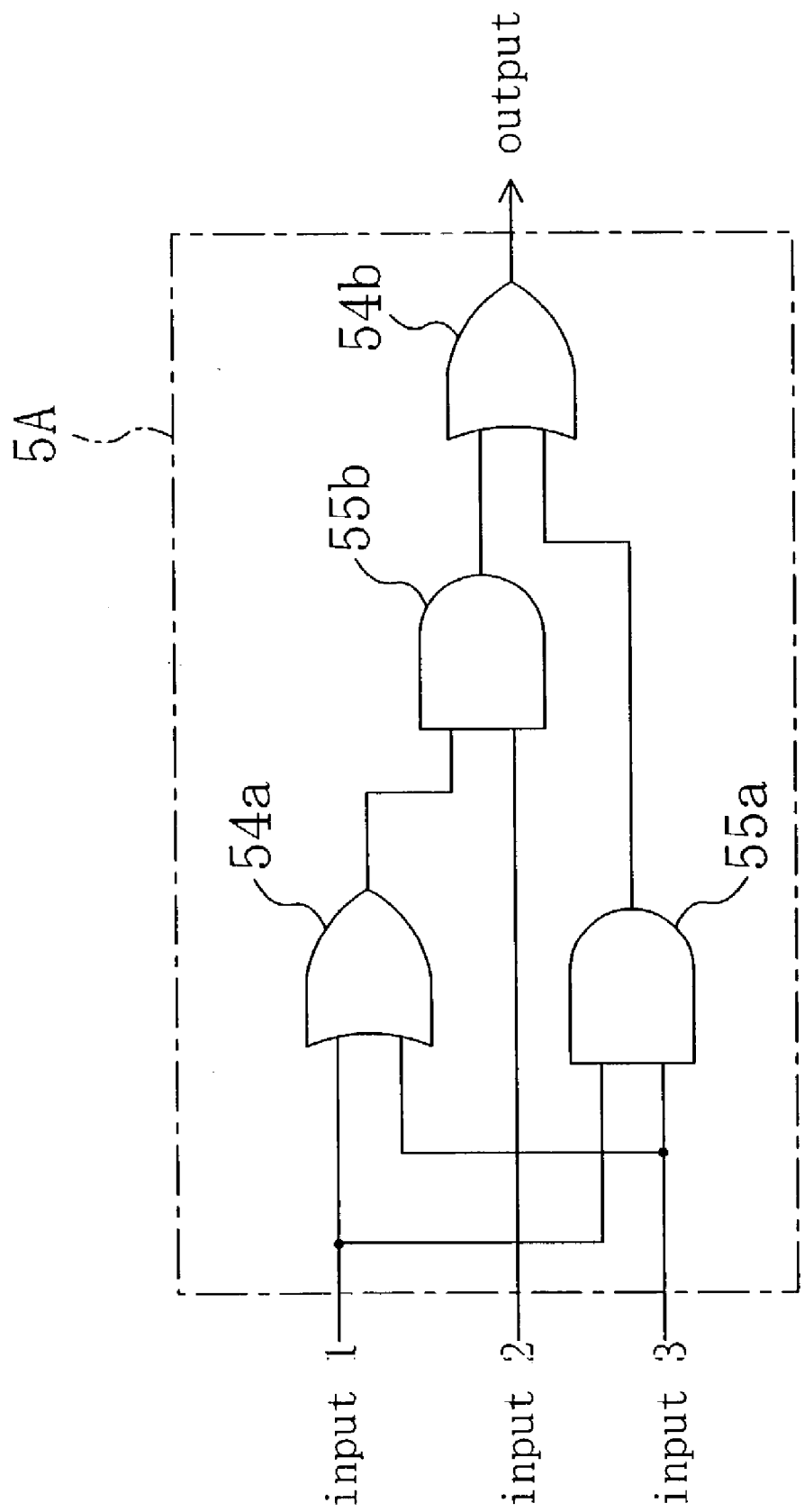
FIG. 4 shows an example of the circuit configuration of the majority decision circuit in FIG. 2.
Figure 5:
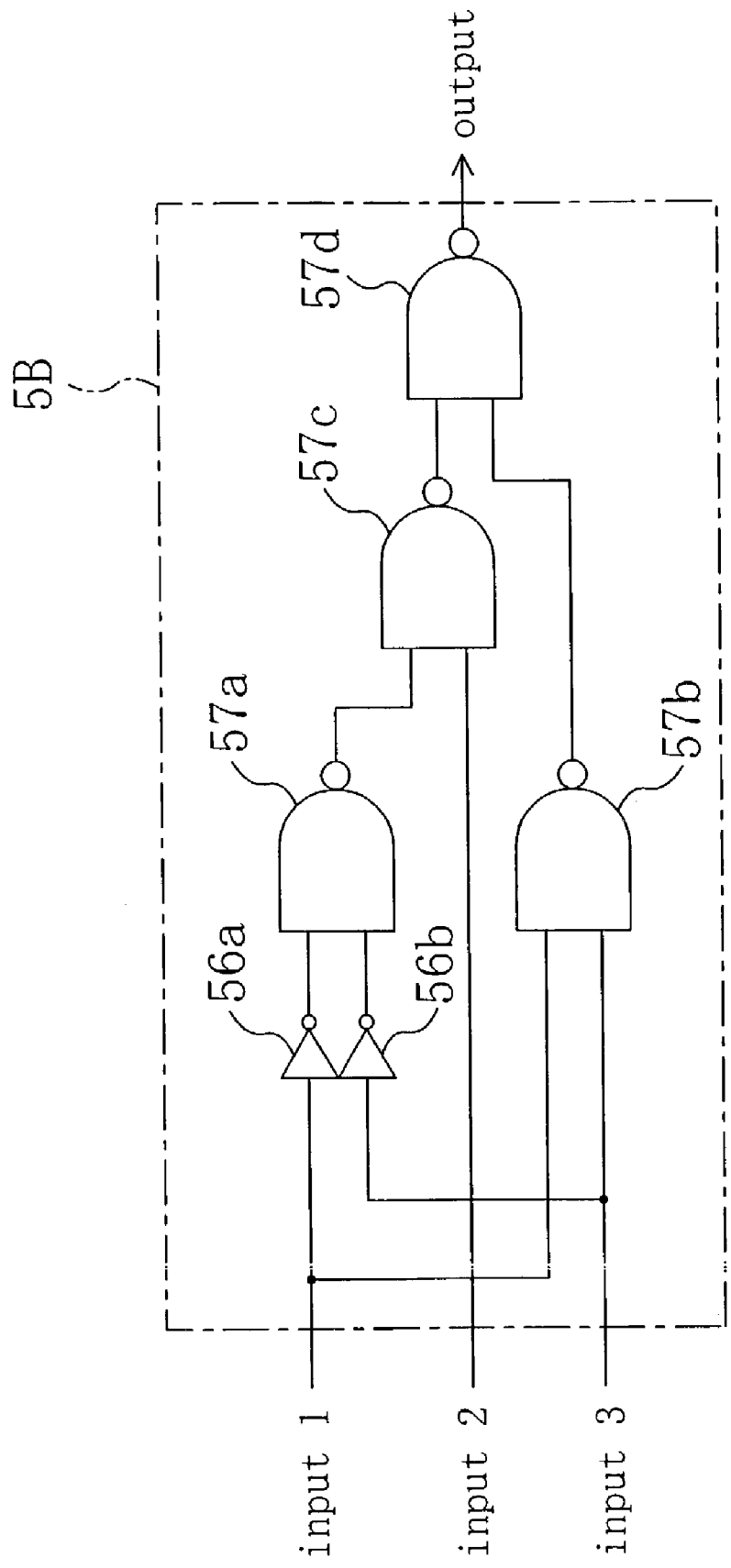
FIG. 5 shows an example of the circuit configuration of the majority decision circuit in FIG. 2.

FIGS. 3 to 5 show examples of the circuit configuration of the majority decision circuit 5. The majority decision circuit 5 shown in FIG. 3 has an exclusive-OR circuit 51 receiving an input 1 and an input 3, a first AND circuit 52*a* receiving the inputs 1 and 3, a second AND circuit 52*b* receiving an output of the exclusive-OR circuit 51 and an input 2, and an OR circuit 53 receiving an output of the first AND circuit 52*a* and an output of the second AND circuit 52*b*. An output of the OR circuit 53 is used as a result of the decision by a majority.

A majority decision circuit 5A shown in FIG. 4 has a first OR circuit 54*a* receiving an input 1 and an input 3, a first AND circuit 55*a* receiving the inputs 1 and 3, a second AND circuit 55*b* receiving an output of the first AND circuit 54*a* and an input 2, and a second OR circuit 54*b* receiving an output of the first AND circuit 55*a* and an output of the second AND circuit 55*b*, and an output of the second OR circuit 54*b* is used as a result of the decision by a majority.

A majority decision circuit 5B shown in FIG. 5 has first and second NOT circuits 56*a* and 56*b* each receiving the inputs 1 and 3, a first NAND circuit 57*a* receiving outputs of the first and second NOT circuits 56*a* and 56*b*, a second NAND circuit 57*b* receiving the inputs 1 and 3, a third NAND circuit 57*c* receiving an output of the first NAND circuit 57*a* and the input 2, and a fourth NAND circuit 57*d* receiving an output of the second NAND circuit 57*b* and an output of the third NAND circuit 57*c*, and an output of the fourth NAND circuit 57*d* is used as a result of the decision by a majority.

In any of the cases of FIGS. 3 to 5, the circuit scale is small and, by adding the small circuits as described above, the performance of Viterbi decoding can be improved.

As described above, according to the embodiment, a decision is made by a majority by using output values of a part of the delay circuits in the path holding part 3*n* at the final stage. Consequently, the circuit scale of the required majority decision circuit is sufficiently small and, moreover, the performance of Viterbi decoding can be improved. Therefore, the high-precision Viterbi decoder with a small circuit scale can be realized.

The Viterbi decoder according to the embodiment may be used to decode a signal which is waveform-equalized by a waveform equalizer. In this case, for example, it is assumed that the waveform equalizer receives a signal modulated by an 8–16 modulation code in which the length of continuous sequences of the same code lies in a range from 2 to 10.

Figure 6:
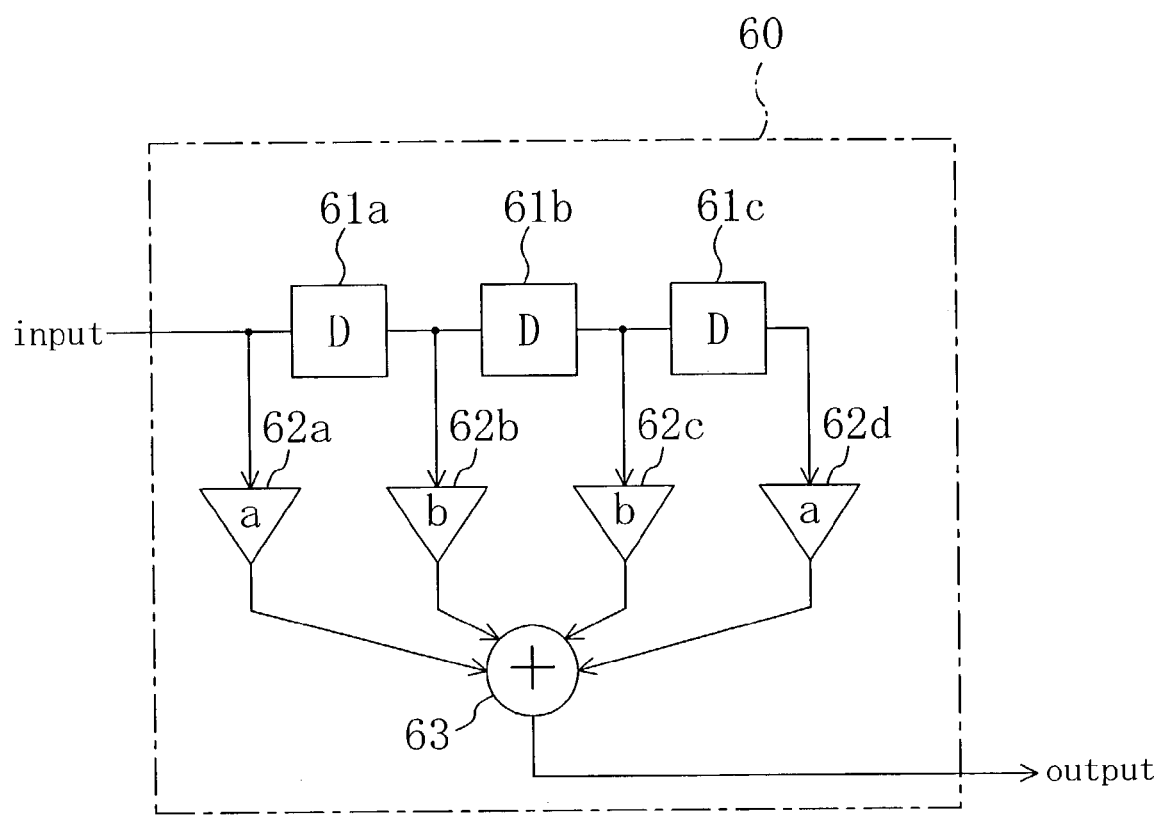
FIG. 6 shows an example of the configuration of a waveform equalizer used together with the Viterbi decoder.

FIG. 6 shows an example of the configuration of the waveform equalizer used with the Viterbi decoder as a set. A waveform equalizer 60 shown in FIG. 6 has four taps and tap coefficients satisfy the relation of "a, b, b, a" where a>b. The waveform equalizer 60 delays an input signal by delay circuits 61*a*, 61*b*, and 61*c*, multiplies the input signal and output signals of the delay circuits 61*a*, 61*b*, and 61*c* by multipliers 62*a*, 62*b*, 62*c*, and 62*d*, adds outputs of the multipliers 62*a* to 62*d* by an adder 63, and outputs the result. It is assumed that an actual communication system and an actual recording/reproducing apparatus have a communication path characteristic and a recording/reproducing system characteristic, respectively, equivalent to those of the waveform equalizer 60.

In the embodiment, outputs of the three delay circuits out of the six delay circuits in the path holding part at the final stage are used for a decision by a majority. The number of delay circuits is not limited to three. By using outputs of a part of the delay circuits, effects similar to those of the embodiment can be obtained. From the viewpoint of improvement in the performance of Viterbi decoding while suppressing increase in the circuit scale, the number of delay circuits used for a decision by a majority is preferably about the half or less of the delay circuits in the path holding part.

Embodiment 2

Figure 7:
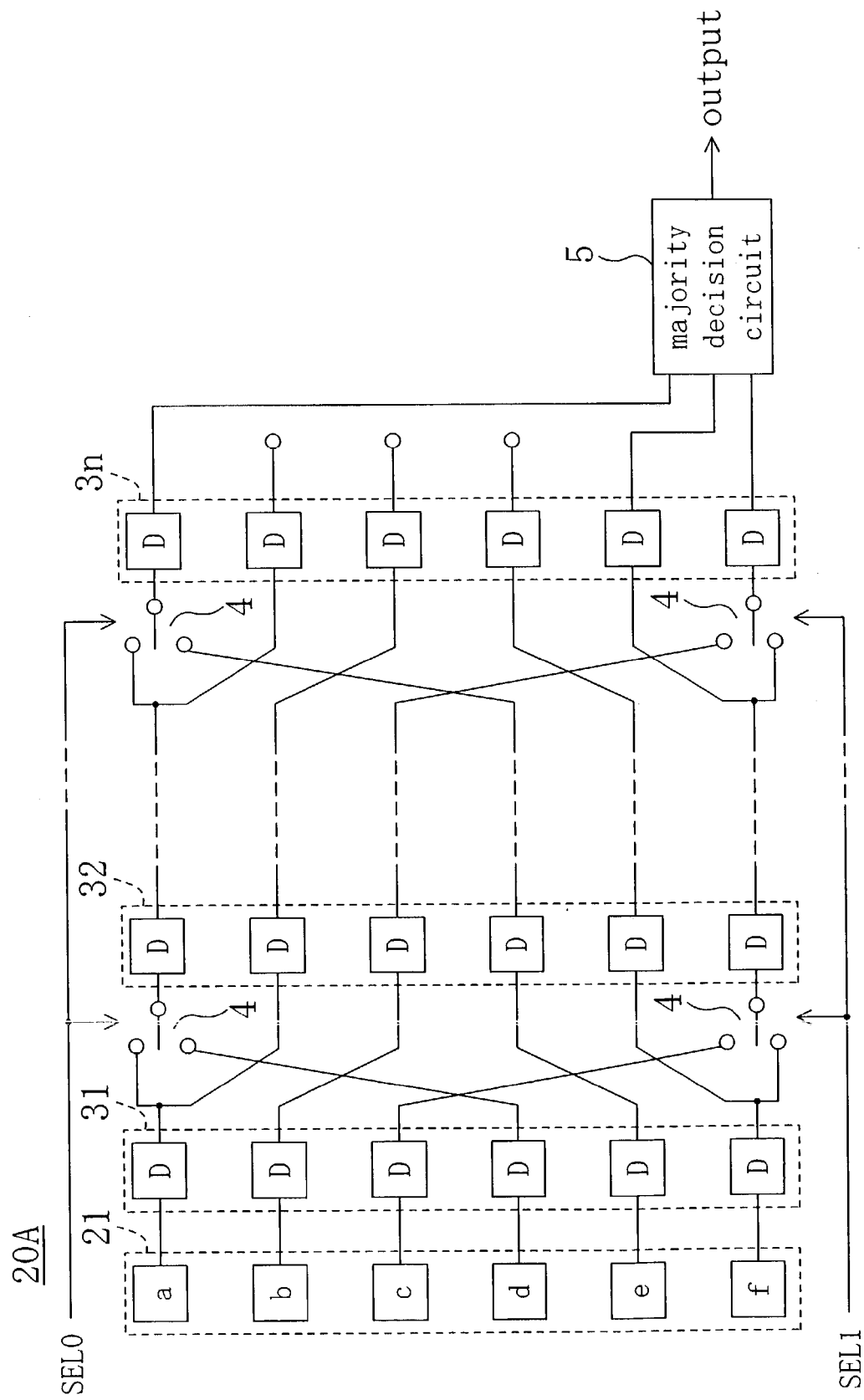
FIG. 7 is a diagram showing the internal configuration of a path storing circuit of a Viterbi decoder according to a second embodiment of the present invention.

FIG. 7 is a diagram showing the internal configuration of a path storing circuit in a Viterbi decoder according to a second embodiment of the present invention. The configuration of FIG. 7 is different from that of FIG. 2 according to the first embodiment with respect to the point that the majority decision circuit 5 receives output values of three delay circuits including the top and bottom delay circuits to each of which the selector 4 is connected to the input side, out of delay circuits in the path holding part 3*n* at the final stage.

The input side of each of the delay circuits other than the top and bottom delay circuits (that is, the second to fifth delay circuits) in the path holding part 3*n* is not connected to the selector 4, but directly connected to an output of a delay circuit in another position in the path holding part at the immediately preceding stage. Consequently, even if output values of the second to fifth delay circuits are used for a decision by a majority, improvement in performance of the Viterbi decoding cannot be expected.

In the embodiment, therefore, by including output values of the top and bottom delay circuits each receiving a selection output of the selector 4 as inputs of the majority decision circuit 5, the performance of Viterbi decoding can be improved with reliability.

Embodiment 3

Figure 8:
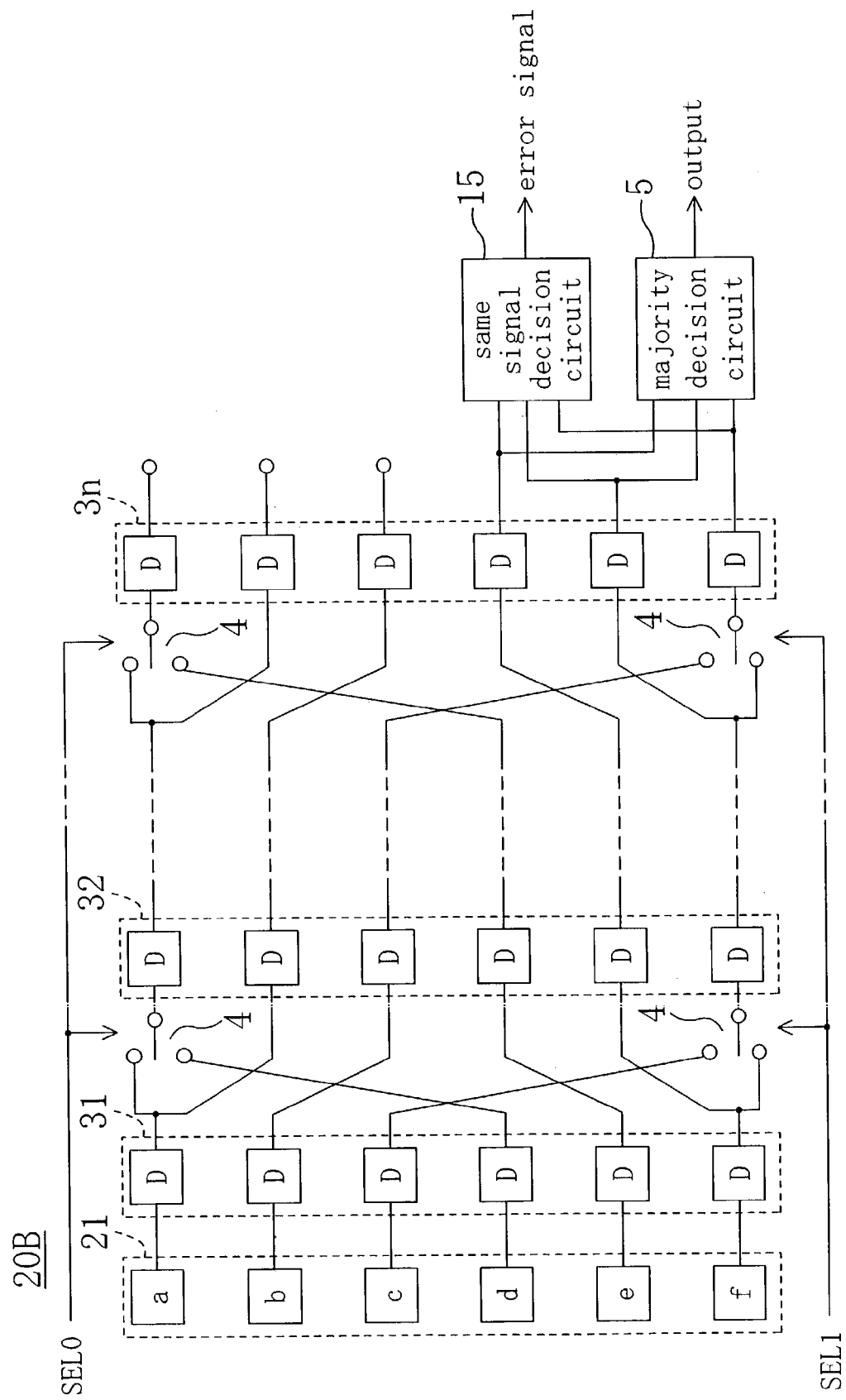
FIG. 8 is a diagram showing the internal configuration of a path storing circuit of a Viterbi decoder according to a third embodiment of the present invention.

FIG. 8 is a diagram showing the internal configuration of a path storing circuit in a Viterbi decoder according to a third embodiment of the present invention. The configuration of FIG. 8 is different from that of FIG. 2 according to the first embodiment with respect to the point that a same signal decision circuit 15 for determining whether all of values input to the majority decision circuit 5 are the same or not is provided.

The same signal decision circuit 15 receives three values input to the majority decision circuit 5 and determines whether the three signals have the same value or not. When the same signal decision circuit 15 determines that the three signals are not the same, an error signal is output. By an output of the same signal decision circuit 15, the quality of a communication path or the quality of a recording/reproduction system characteristic can be checked. The performance of Viterbi decoding can be also checked. In the case where an error occurs, interruption of a decoding process, a request of re-transmission of a signal, and the like can be performed.

According to the third embodiment, therefore, interruption of a decoding process and a signal re-transmission request can be performed, so that a higher-precision Viterbi decoder can be realized.

Although the foregoing embodiments have been described on the precondition of using the Viterbi decoding shown in FIGS. 10 and 11, the invention is not limited to the Viterbi decoding.

According to the present invention as described above, the circuit scale of the required majority decision circuit is sufficiently small and, moreover, the performance of Viterbi decoding can be improved. Therefore, a high-precision Viterbi decoder with a small circuit scale can be realized.

What is claimed is:

1. A Viterbi decoder comprising
a path storing circuit,
said path storing circuit including:
path holding parts at a plurality of stages corresponding to times, respectively, said path holding parts storing a survivor path;
a plurality of selectors for selecting a value to be input to said path holding parts in accordance with a path selection signal; and
a majority decision circuit for receiving output values of only a part of delay circuits in said path holding part at the final stage and making a majority decision.

2. The Viterbi decoder of claim 1, wherein
said majority decision circuit receives output values of half or less of the delay circuits in said path holding part at the final stage.

3. The Viterbi decoder of claim 1, wherein
the Viterbi decoder decodes a signal which is waveform equalized by a waveform equalizer,
said waveform equalizer has four taps, and tap coefficients satisfy the relation of "a, b, b, a".

4. The Viterbi decoder of claim 1, wherein
the Viterbi decoder decodes a signal which is waveform equalized by a waveform equalizer, and
said waveform equalizer receives a signal modulated by an 8–16 modulation code of which length of continuous sequences of the same code lies in a range from 2 to 10.

5. The Viterbi decoder of claim 1, wherein said majority decision circuit receives outputs of all of delay circuits each receiving a selected output of said selector in said path holding part at the final stage.

6. The Viterbi decoder of claim 1, wherein said path storing circuit has a same signal decision circuit for determining whether all of values input to said majority decision circuit are the same or not.

7. The Viterbi decoder of claim 1, wherein said majority decision circuit receives output values of three delay circuits in said path holding part at the final stage.

8. The Viterbi decoder of claim 7, wherein said majority decision circuit receives the output values of said three delay circuits as first, second, and third input signals and comprises:

an exclusive-OR circuit receiving said first and third input signals;
a first AND circuit receiving said first and third input signals;
a second AND circuit receiving an output of said exclusive-OR circuit and said second input signal; and
an OR circuit receiving an output of said first AND circuit and an output of said second AND circuit, and
said majority decision circuit outputs an output of said OR circuit as a result of the majority decision.

9. The Viterbi decoder of claim 7, wherein said majority decision circuit receives the output values of said three delay circuits as first, second, and third input signals and comprises:

a first OR circuit receiving said first and third input signals;
a first AND circuit receiving said first and third input signals;
a second AND circuit receiving an output of said first OR circuit and said second input signal; and
a second OR circuit receiving an output of said first AND circuit and an output of said second AND circuit, and
said majority decision circuit outputs an output of said second OR circuit as a result of the majority decision.

10. The Viterbi decoder of claim 7, wherein said majority decision circuit receives the output values of said three delay circuits as first, second, and third input signals and comprises:

a first NOT circuit receiving said first signal;
a second NOT circuit receiving said third input signal;
a first NAND circuit receiving an output of said first NOT circuit and an output of said second NOT circuit;
a second NAND circuit receiving said first and third input signals;
a third NAND circuit receiving an output of said first NAND circuit and said second input signal; and
a fourth NAND circuit receiving an output of said second NAND circuit and an output of said third NAND circuit, and
said majority decision circuit outputs an output of said fourth NAND circuit as a result of the majority decision.

* * * * *